United States Patent
Shida et al.

(10) Patent No.: US 7,201,858 B2
(45) Date of Patent: Apr. 10, 2007

(54) FLUORESCENT SUBSTANCE, METHOD OF MANUFACTURING FLUORESCENT SUBSTANCE, AND LIGHT EMITTING DEVICE USING THE FLUORESCENT SUBSTANCE

(75) Inventors: Naomi Shida, Tokyo (JP); Masaaki Tamatani, Fujisawa (JP); Kazuaki Otsuka, Yokosuka (JP); Yoshihito Tsutsui, Chigasaki (JP); Ryosuke Hiramatsu, Kawasaki (JP)

(73) Assignees: Kabushiki Kaisha Toshiba, Tokyo (JP); Toshiba Materials Co., Ltd., Kanagawa (JP)

( * ) Notice: Subject to any disclaimer, the term of this patent is extended or adjusted under 35 U.S.C. 154(b) by 0 days.

(21) Appl. No.: 11/389,768

(22) Filed: Mar. 27, 2006

(65) Prior Publication Data

US 2006/0231796 A1    Oct. 19, 2006

Related U.S. Application Data

(63) Continuation of application No. PCT/JP2005/019441, filed on Oct. 17, 2005.

(30) Foreign Application Priority Data

Oct. 18, 2004   (JP) .............................. 2004-303510

(51) Int. Cl.
  *C09K 11/79*   (2006.01)
  *H05B 33/14*   (2006.01)
(52) U.S. Cl. ................ 252/301.4 F; 313/503; 257/98
(58) Field of Classification Search ..................... None
  See application file for complete search history.

(56) References Cited

U.S. PATENT DOCUMENTS

2006/0011936 A1    1/2006    Hiramatsu et al.
2006/0081814 A1*   4/2006    Shida et al. .......... 252/301.4 F

FOREIGN PATENT DOCUMENTS

JP    2003-110150        4/2003
WO    WO 02/054502 A1    7/2002
WO    WO 05/027231 A1    3/2005

OTHER PUBLICATIONS

U.S. Appl. No. 11/249,946, filed Oct. 13, 2005, Shida et al.
International Search Report for PCT/JP2005/019441, dated Feb. 8, 2006.
Written Opinion of the International Searching Authority for PCT/JP2005/019441, dated Feb. 8, 2006.
Park, et al., White light-emitting diodes of GaN-based Sr2SiO4: Eu and the luminescent properties, Applied Physics Letters, vol. 82, No. 5, Feb. 3, 2003.
Poort, et al., Optical properties of Eu2+-activated orthosilicates and orthophosphates, Journal of Alloys and Compounds, 260 (1997) 93-97.

(Continued)

*Primary Examiner*—C. Melissa Koslow
(74) *Attorney, Agent, or Firm*—Amin, Turocy & Calvin, LLP

(57) ABSTRACT

Disclosed is a fluorescent substance comprising an alkaline earth metal silicate having a composition represented by the following general formula (1):

$$(Sr_{1-x-y-z}Ba_xCa_yEu_z)_2Si_wO_{2+2w} \qquad (1)$$

where x, y, z and w fall within the ranges of:
  $0 \leq x \leq 0.97$; $0 \leq y \leq 0.97$;
  $0.03 \leq z \leq 0.20$; $1.00 < w\ 1.10$.

20 Claims, 3 Drawing Sheets

OTHER PUBLICATIONS

Kim, et al., GaN-Based White-Light-Emitting Diodes Fabricated with a Mixture of Ba3MgSi2O8:Eu2+ and Sr2SiO4:Eu2+ Phosphors, Japanese Journal of Applied Physics, vol. 43, No. 3, 2004, pp. 989-992.

G. Blasse, et al., Fluorescence of Eu2+-Activated Sillcates, Philips Res. Repts 23, 189-200, 1968.

Peek, et al., The potential of Eu2+ activated barium-strontium orthosilicate as a green emitting phosphor for the use in triphosphor fluorescent lamps.

* cited by examiner

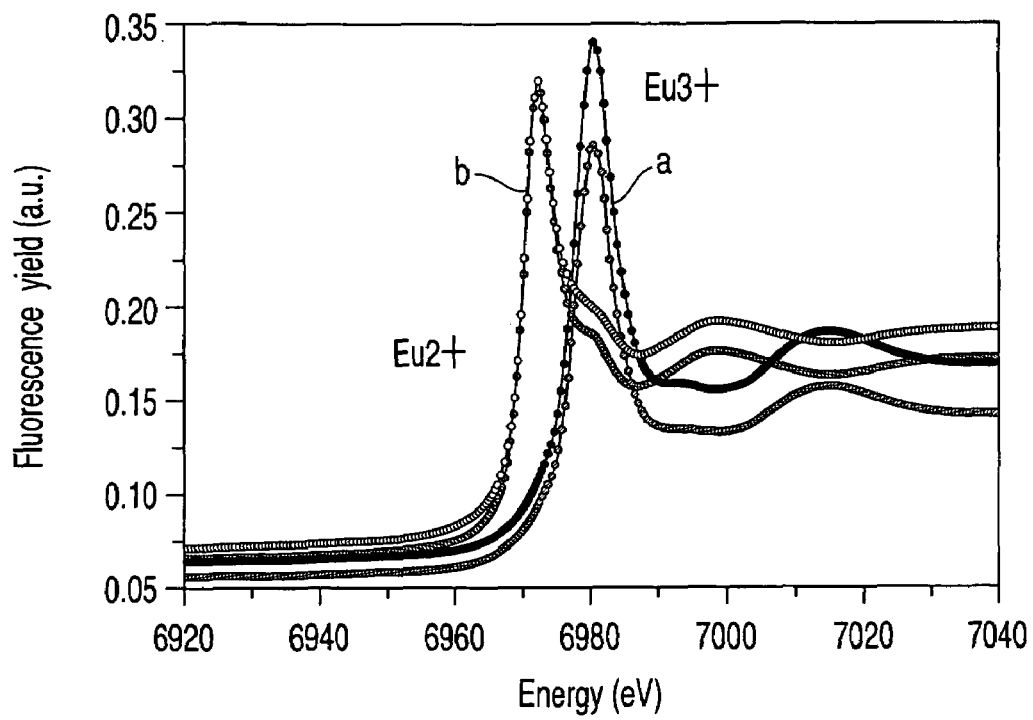
F I G. 1
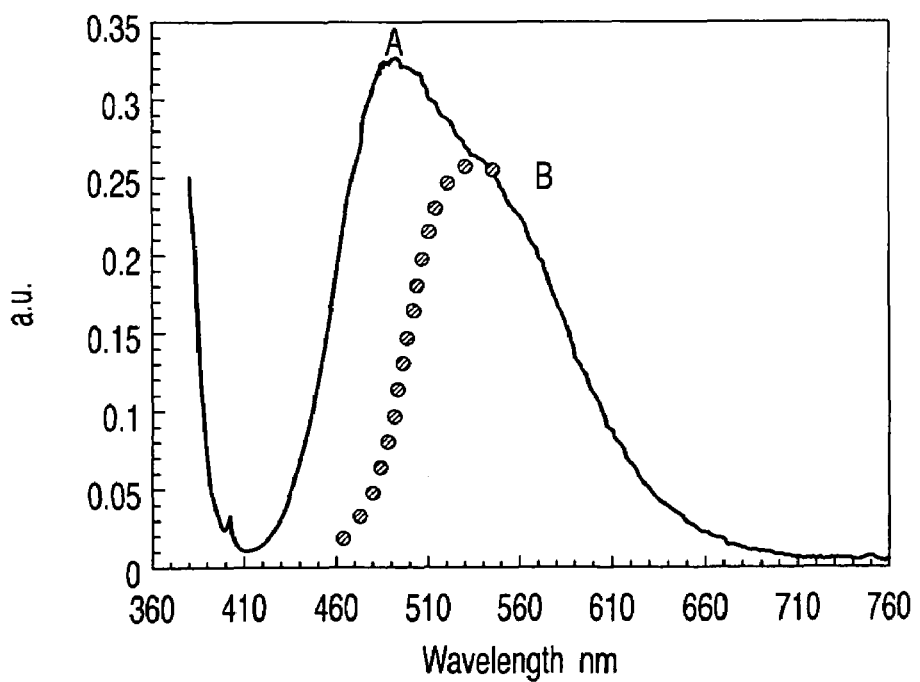
F I G. 2

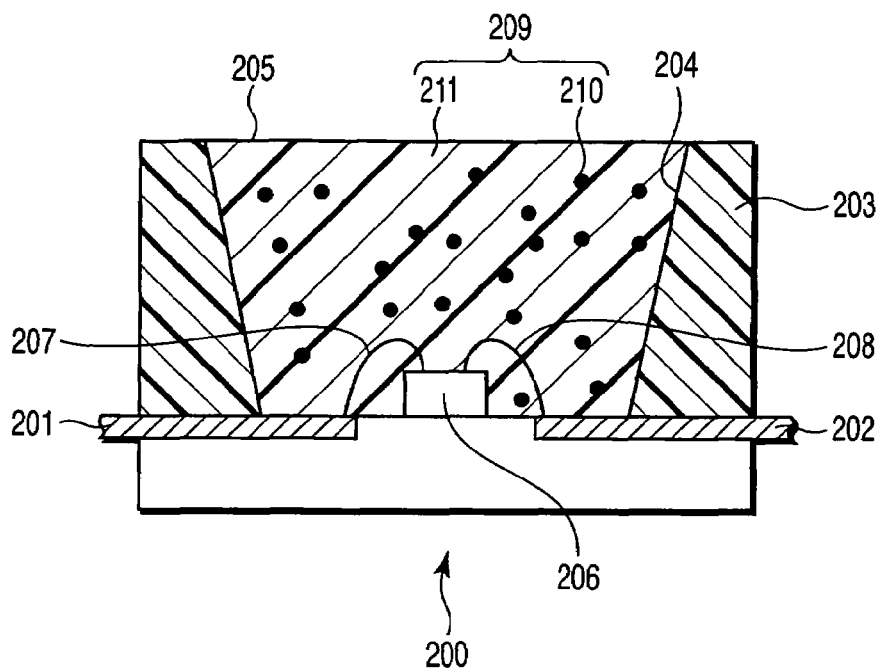
F I G. 3
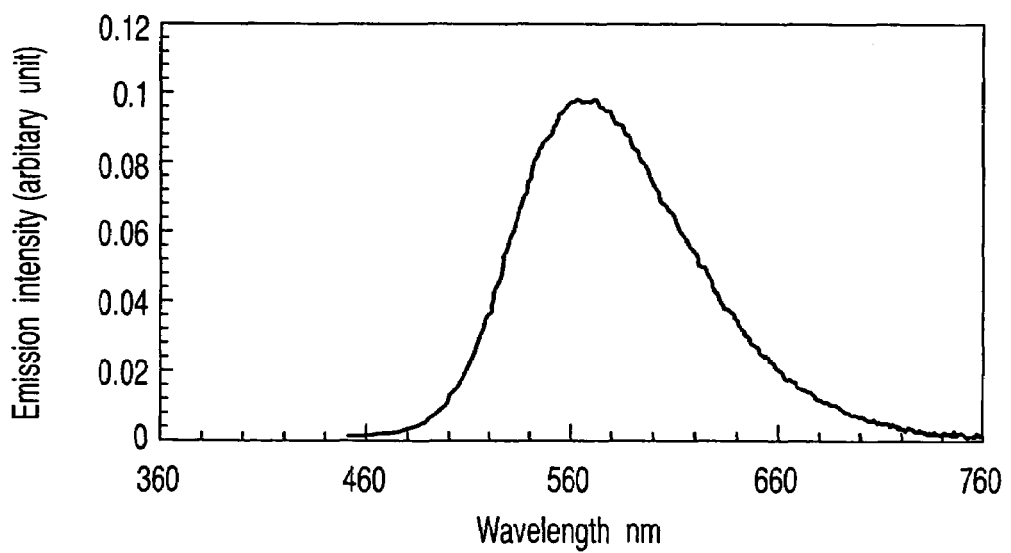
F I G. 4

FLUORESCENT SUBSTANCE, METHOD OF MANUFACTURING FLUORESCENT SUBSTANCE, AND LIGHT EMITTING DEVICE USING THE FLUORESCENT SUBSTANCE

CROSS-REFERENCE TO RELATED APPLICATIONS

This is a Continuation Application of PCT Application No. PCT/JP2005/019441, filed Oct. 17, 2005, which was published under PCT Article 21(2) in English.

This application is based upon and claims the benefit of priority from prior Japanese Patent Application No. 2004-303510, filed Oct. 18, 2004, the entire contents of which are incorporated herein by reference.

BACKGROUND OF THE INVENTION

1. Field of the Invention

The present invention relates to a fluorescent substance, a manufacturing method of a fluorescent substance, and a light-emitting device using the fluorescent substance.

2. Description of the Related Art

An LED lamp using a light-emitting diode is used in various display devices including, for example, a portable device, a PC peripheral device, an OA device, various switches, a light source for the back light, and a display board. The LED chip, which is a semiconductor element, has a long life and exhibits a high reliability and, thus, when used as a light source, the replacing work can be reduced. Such being the situation, the application of the LED chip to various uses is being attempted.

The known LED lamp includes a lamp using in combination a light-emitting diode used as an exciting light source and a fluorescent substance. It is possible for the particular lamp to emit light of various colors depending on the kind of the combination noted above. In order to obtain a so-called white LED, i.e., a light-emitting device that emits a white light, known is the combination of a light-emitting diode that emits light having a wavelength of 360 nm to 500 nm, e.g., a light-emitting diode having a GaN-based compound semiconductor layer, and a fluorescent substance. In the above combination, known are a combination of a blue-light-emitting diode and a yellow-emitting fluorescent substance and another combination of a near-ultraviolet light-emitting diode, a blue-emitting fluorescent substance, a yellow-emitting fluorescent substance and a red-emitting fluorescent substance. Incidentally, the term "near-ultraviolet light" noted above denotes an ultraviolet light having a wavelength of 360 nm to 410 nm. As described above, the fluorescent substance used in the LED lamp is required to absorb efficiently the near-ultraviolet light to blue light having a wavelength of 360 nm to 500 nm and to emit also efficiently the visible light.

A yellow-emitting YAG:Ce-type fluorescent substance is known well as a fluorescent substance used in the white LED. However, when excited by the near-ultraviolet light having a wavelength of 360 nm to 410 nm, the luminescence efficiency from the YAG:Ce-type fluorescent substance is low. Therefore, the application of the YAG:Ce-type fluorescent substance is limited to the combination with a blue LED. Also, the emission spectrum of the YAG-type fluorescent substance has a wide emission spectral band and, thus, the emission efficiency as a white LED is limited.

A divalent europium-activated silicate fluorescent substance, i.e., $(M, Eu)_2SiO_4$ (M representing an alkaline earth metal) is known as a fluorescent substance that emits luminescence of colors ranging from green to yellow or orange when excited by the near-ultraviolet light or the blue.

Already proposed as a silicate fluorescent substance for LED is $(M, Eu)_2SiO_4$ (M representing an alkaline earth metal), where $Si \leq 1.00$. The properties of the silicate fluorescent substance excited by an ultraviolet light having a short wavelength of 254 nm have already been examined. It has been reported that, where the Si amount is larger by only 0.5% than the stoichiometric composition, the emission efficiency is lowered to about 50% of that of the stoichiometric composition.

The light-emitting device utilizing the combination of the conventional silicate fluorescent substance and the LED is required to exhibit a higher emission output. The present invention is intended to provide a fluorescent substance that makes it possible to obtain a light-emitting device of a high output, to provide a manufacturing method that makes it possible to manufacture the particular fluorescent substance with a high stability, and to provide a light-emitting device of a high output.

BRIEF SUMMARY OF THE INVENTION

A fluorescent substance according to one aspect of the present invention comprises an alkaline earth metal silicate having a composition represented by the following general formula (1):

$$(Sr_{1-x-y-z}Ba_xCa_yEu_z)_2Si_wO_{2+2w} \qquad (1)$$

where x, y, z and w fall within the ranges of:
$0 \leq x \leq 0.97$; $0 \leq y \leq 0.97$;
$0.03 \leq z \leq 0.20$; $1.00 < w < 1.10$.

A method for manufacturing a europium-activated alkaline earth metal silicate fluorescent substance according to one aspect of the present invention comprises storing a mixture of raw materials into a vessel; applying a first baking to the mixture of the raw materials under a reducing gas atmosphere of $N_2/H_2$ so as to obtain a first baked material; pulverizing the first baked material to obtain a pulverized first baked material; storing the pulverized first baked material into a vessel; placing the vessel storing the pulverized first baked material in a furnace and substituting a nitrogen gas in the furnace under vacuum; and applying a second baking to the pulverized first baked material under a reducing gas atmosphere of $N_2/H_2$ having a hydrogen concentration of 1 to 100% so as to obtain a second baked material.

A light-emitting device according to one aspect of the present invention comprises a light-emitting element configured to emit a light having a wavelength of 360 nm to 500 nm, and a layer comprising a fluorescent substance formed on the light-emitting element, the fluorescent substance comprising an alkaline earth metal silicate having a composition represented by the following general formula (1):

$$(Sr_{1-x-y-z}Ba_xCa_yEu_z)_2Si_wO_{2+2w} \qquad (1)$$

where x, y, z and w fall within the ranges of:
$0 \leq x \leq 0.97$; $0 \leq y \leq 0.97$;
$0.03 \leq z \leq 0.20$; $1.00 < w < 1.10$.

BRIEF DESCRIPTION OF THE SEVERAL VIEWS OF THE DRAWING

FIG. 1 shows ZANES spectra of europium-activated alkaline earth metal silicate fluorescent substances;

FIG. 2 shows the emission spectra of europium-activated alkaline earth metal silicate fluorescent substances;

FIG. 3 schematically shows the construction of a light-emitting device according to one embodiment of the present invention;

FIG. 4 shows an emission spectrum of the europium-activated alkaline earth metal silicate fluorescent substance for Example 1.

DETAILED DESCRIPTION OF THE INVENTION

Figure 5:
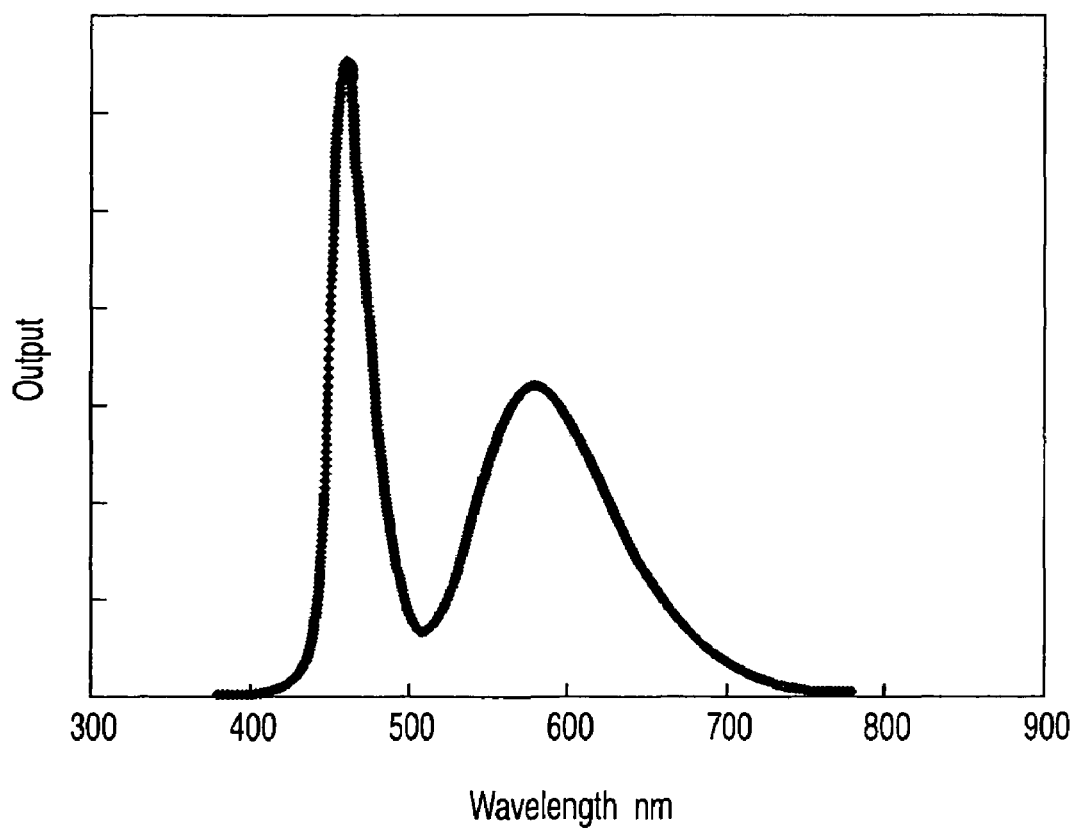
FIG. 5 shows the emission spectrum of the white LED for Example 11.

Embodiments of the present invention will now be described.

As a result of a test applied to the conventional silicate fluorescent substance for LED, the present inventors have found that, since the particular fluorescent substance is small in its capability of absorbing the light in the blue light region having a wavelength of 440 nm to 480 nm, it is impossible to obtain a white LED emitting a light having a sufficient brightness when the particular fluorescent substance is combined with a light-emitting diode excited by the blue light. Where the amount of Eu was increased in an attempt to increase the light-absorbing capability under the blue light region, the light emitting efficiency was found to be lowered rapidly. Further, the raw materials and the manufacturing environment were found to be greatly affected by water so as to make it difficult to manufacture the light-emitting device with a high reproducibility.

Also, when the amount of Si was small, the resistance of the manufactured fluorescent substance to water was found to be lowered rapidly. In this case, an emission band generated from an unknown source and having a wavelength not longer than 500 nm appeared in the emission spectrum in addition to the emission band (main emission band) having a peak at 500 nm to 600 nm, increasing the width of the spectrum and, thus, lowering the emission efficiency of the white LED. It was difficult to reduce the intensity of the emission band originating from the unknown source and to obtain a good reproducibility in fluorescent properties. On the other hand, where the Si amount was made slightly excessive compared with the stoichiometric composition, the emission efficiency was rapidly lowered when excited by the near-ultraviolet light or the blue light.

Based on the finding described above, the present inventors have found that a light-emitting device having a high output can be obtained by limiting the composition of the Eu-activated alkaline earth metal silicate fluorescent substance to fall within a specified range. To be more specific, the fluorescent substance according to one embodiment of the present invention has a composition represented by general formula (1) given below:

$$(Sr_{1-x-y-z}Ba_xCa_yEu_z)_2Si_wO_{2+2w} \qquad (1)$$

where x, y, z and w fall within the ranges of:
$0 \leq x \leq 0.97$; $0 \leq y \leq 0.97$;
$0.03 \leq z \leq 0.20$; $1.00 < w < 1.10$.

In general, the composition of the fluorescent substance differs from the composition of the charged raw materials depending on the firing (baking) conditions such as the amounts of water and flux contained in the raw materials. The composition denoted by general formula (1) given above is what is obtained by analyzing the obtained fluorescent substance.

The compositional ratios x and y of the alkaline earth metals are determined by the facts that Sr, Ca and Ba form a complete solid solution. The Eu amount is determined by its affect to the fluorescence efficiency.

Where the Eu content is excessively low, the absorbance of the fluorescent substance for absorbing the light of the blue region having a wavelength of 440 nm to 480 nm is lowered, making it difficult to obtain a high emission efficiency when the fluorescent substance is excited by the blue light. On the other hand, where the Eu content is excessively high, the fluorescence efficiency is lowered due to the so-called "concentration quenching phenomenon". Such being the situation, the compositional ratio z of Eu is limited to fall within a range of 0.03 and 0.20, i.e., $0.03 \leq z \leq 0.20$, more desirably to fall within a range of 0.035 and 0.075, i.e., $0.035 \leq z \leq 0.075$.

Where the Si content is excessively low, trivalent europium ($Eu^{3+}$) tends to remain in the fluorescent substance. As a result, an inconvenience is brought about that a new emission band appears in the vicinity of 495 nm in addition to the aimed emission band having a peak wavelength not shorter than 500 nm, increasing the width of the emission spectrum. Also, the resistance of the fluorescent substance to water is lowered. On the other hand, where the Si content is excessively high, $SiO_2$ lumps that do not emit luminescence appear in the fluorescent substance powder, lowering the emission efficiency. At the same time, the fluorescent substance powder brings about a troublesome problem of non-uniform coating layer formed on an LED chip. Such being the situation, the compositional ratio w of Si is defined to be larger than 1.00 and smaller than 1.10, i.e., $1.00 < w < 1.10$.

As described above, the Eu content and the Si content are defined in the fluorescent substance of the embodiment of the present invention, with the result that the fluorescent substance of the embodiment of the present invention is enabled to emit luminescence of colors ranging green to orange with a high emission efficiency by the excitation with light having a wavelength of 360 nm to 500 nm. In other words, the fluorescent substance of the embodiment of the present invention is enabled to emit luminescence of green, yellowish green, or colors ranging from yellow to orange.

It is desirable for the fluorescent substance according to the embodiment of the present invention, which emits luminescence of green, yellowish green, yellow or orange, to be used in a light-emitting device in combination with a light-emitting diode (LED or a laser diode) having an emission peak in a blue region having a wavelength of 440 nm to 480 nm. It is also possible for the fluorescent substance of the embodiment of the present invention to be used in combination with another red or blue fluorescent substance so as to permit the light-emitting device to emit a white light in the case where the light source emits the near-ultraviolet light to violet light having a wavelength of 360 nm to 440 nm.

As a result of an extensive research on the Eu-activated alkaline earth metal silicate fluorescent substance, the present inventors have found that, the divalent europium and the trivalent europium are present together in the fluorescent substance, these Eu ions differing from each other in valency affect the light emitting efficiency and the emission spectrum of the fluorescent substance. FIG. 1 shows the XANES spectrum of the alkaline earth metal silicate fluorescent substance manufactured by the conventional manufacturing method. The term "XANES" noted above is the abbreviation of X-ray Absorption Near Edge Structure, which is a kind of analytical method included in the X-ray Absorption Fine Structure (XAFS) measurement method.

In the spectrum shown in FIG. 1, the peak of curve "a" in the vicinity of 6980 eV is derived from $Eu^{3+}$, and the peak of curve b in the vicinity of 6970 eV is derived from $Eu^{2+}$. The vicinity noted above denotes the range of ±4 eV. It should be noted that, in the XANES analysis, the position of the lowest first peak is significant in the valency judgment of Eu. It should be noted that, where the first peak is present at 6970 eV, $Eu^{3+}$ is not necessarily present even if a small second peak is present at 6980 eV.

FIG. 2 shows the emission spectrum of a sample containing a large amount of $Eu^{3+}$ among the fluorescent substances used for the XANES analysis noted above, covering the case where the near-ultraviolet light having a wavelength of 395 nm was used for the excitation. As shown in FIG. 2, if $Eu^{3+}$ is contained in a large amount, the light emission band A is strengthened in the vicinity of 495 nm. In this case, it has been clarified that the resistance to humidity is also affected adversely at the same time. Incidentally, peak B in the vicinity of 560 nm represents the emission peak of $Eu^{2+}$ that is not affected by $Eu^{3+}$. Note that the emission band A, though its intensity is increased with increase in the amount of $Eu^{3+}$, is considered to originate also from $Eu^{2+}$, because the emission spectrum is very simple and broad compared to that originating from $Eu^{3+}$. To be more specific, there are two kinds of luminescent centers of $Eu^{2+}$ corresponding to emission bands A and B, respectively, within the crystal of the fluorescent substance, and these two luminescent centers are considered to differ from each other in the ion arrangement around the $Eu^{2+}$ ion. The detailed information on the ion arrangement around the $Eu^{2+}$ corresponding to the emission band A has not yet been analyzed.

In the conventional manufacturing method utilizing the simple reduction, it has been found that an emission band having a peak in the vicinity of 495 nm tends to be generated when the Si content is lower than the stoichiometric composition (w=1), i.e., when the Si compositional ratio w is lower than 1 (w<1). The particular emission band also tends to be generated when water is contained in the raw materials and when the amount of flux is excessively small so as to make insufficient the reaction during the firing (baking). The particular emission band also tends to be generated when the reducing conditions to $Eu^{2+}$ are insufficient during the firing. It follows that, if $Eu^{3+}$ is reduced completely into $Eu^{2+}$, it was considered possible to suppress the appearance of the emission band having a peak in the vicinity of 495 nm. The fluorescent substance according to the embodiment of the present invention can be manufactured under a thorough reducing atmosphere. To be more specific, the fluorescent substance according to this embodiment of the present invention is manufactured by the method comprising storing a mixture of raw materials into a vessel; applying a first baking to the mixture of the raw materials under a reducing gas atmosphere of $N_2/H_2$ so as to obtain a first baked material; pulverizing the first baked material to obtain a pulverized first baked material; storing the pulverized first baked material into a vessel; placing the vessel storing the pulverized first baked material in a furnace and substituting a nitrogen gas in the furnace under vacuum; and applying a second baking to the pulverized first baked material under a reducing gas atmosphere of $N_2/H_2$ having a hydrogen concentration of 1 to 100% so as to obtain a second baked material.

The oxide powder of the constituting element can be used as the starting material. To be more specific, a prescribed amount of the oxide powder of the constituting element is weighted, and an appropriate amount of ammonium chloride is added as a crystal growth-promoting agent (flux) to the oxide powder, followed by mixing these materials by using, for example, a ball mill. It is possible to use, for example, $Eu_2O_3$, etc. as a raw material for Eu; $CaCO_3$, etc. as a raw material for Ca; $SrCO_3$, etc. as a raw material for Sr; $BaCO_3$, etc. as a raw material for Ba; and $SiO_2$, etc. as a raw material for Si.

It is possible to use various materials as the crystal growth-promoting agent, such as chloride, fluoride, bromide or iodide of ammonium, an alkali metal or an alkaline earth metal. In order to prevent the promotion of the moisture absorbing properties, it is desirable for the crystal growth-promoting agent to be added in an amount of 0.01 part by weight to 0.3 part by weight based on the total amount of the raw material powders.

The mixed raw material prepared by mixing these raw material powders is placed (stored) in a vessel such as a crucible and fired (baked) at 1,000 to 1,600° C. for 3 to 7 hours under a reducing gas atmosphere consisting of a mixed gas of $N_2/H_2$ so as to obtain a first fired material. The first fired material thus obtained is pulverized and placed again in the vessel. The first baked material may be placed another vessel. The degree of pulverization is not particularly defined. It suffices to pulverize the lumps and aggregates formed by the first firing by using, for example, a mortar so as to increase the surface area of the first fired material.

The vessel containing the pulverized first fired material is placed again in the furnace and a nitrogen gas is substituted in the furnace under a vacuum. It is desirable for the vacuum to be 1,000 Pa or less. If the degree of vacuum exceeds 1,000 Pa, it is impossible to remove the water adhered onto the powder material.

In the next step, the pulverized first fired material is fired at 1,000 to 1,600° C. for 2 to 6 hours under a reducing gas atmosphere of $N_2/H_2$ having a hydrogen concentration of 1% to 100%. If the hydrogen concentration is lower than 1%, it is difficult to reduce $Eu^{3+}$ completely into $Eu^{2+}$. By the first and second firings described above, $Eu^{3+}$ is reduced so as to be converted into $Eu^{2+}$ substantially completely.

In the case of the conventional manufacturing method, in which the fluorescent substance is manufactured simply under a reducing gas atmosphere, the emission from the fluorescent substance includes the emission from $Eu^{2+}$ derived from $Eu^{3+}$ because of the insufficient reduction into $Eu^{2+}$ as described previously. In the embodiment of the present invention, however, the furnace is evacuated first, followed by substituting in the furnace a reducing gas atmosphere having a prescribed hydrogen concentration so as to form a thorough reducing gas atmosphere. Therefore, the reduction of $Eu^{3+}$ to $Eu^{2+}$ is achieved completely so as to eliminate $Eu^{3+}$ substantially completely.

By the firing under the thorough reducing gas atmosphere, the presence of $Eu^{3+}$ has been eliminated so as to eliminate the emission of 495 nm relating to $Eu^{3+}$. As a result, the obtained emission spectrum consists of a single emission band having a peak at the wavelength of 500 nm to 600 nm. The expression "single emission band" denotes the band shape having a single emission peak and not exhibiting shoulder-like undulations. Since the emission spectrum forms a single emission band, the width of the spectrum is reduced so as to make it possible to select the emission band in conformity with the visual sensitivity. Such being the situation, it is possible to design the emission spectrum of a white LED having a high emission efficiency (having a large lumen equivalent).

In the fluorescent substance manufactured by the conventional method, which contains an excessively large amount of Si (w>1) and also contains Eu such that the value of the Eu compositional ratio z is 0.03 to 0.2, i.e., $0.03 \leq z \leq 0.2$, the emission efficiency is rapidly lowered. However, it has been found quite unexpectedly that, where the fluorescent substance of the same composition is manufactured by the firing under a thorough reducing gas atmosphere as in the embodiment of the present invention, the fluorescent substance is enabled to exhibit an emission efficiency higher than that exhibited by the fluorescent substance manufactured by the conventional method. To be more specific, in the fluorescent substance manufactured by the conventional method that does not involve the nitrogen gas substitution under vacuum, the emission efficiency under excitation with light emitted from a light-emitting diode emitting an ultraviolet light having a peak wavelength of 395 nm is lowered with increase in the Si content. To be more specific, the emission efficiency is lowered with increase in the Si content, compared with the case where the silicon compositional ratio w=1.00. For example, where the silicon compositional ratio w is slightly increased to 1.01, the emission efficiency is lowered to 70% of that in the case where silicon compositional ratio w is 1.00. Also, where the silicon compositional ratio w is increased to 1.02, the emission efficiency is lowered to 20% of that in the case where silicon compositional ratio w is 1.00. On the other hand, when it comes to the fluorescent substance manufactured by the method of the embodiment of the present invention involving the reduction under a thorough reducing gas atmosphere, the emission efficiency was increased from 105% to 110% when the fluorescent substance was excited with light emitted from a light-emitting diode emitting an ultraviolet light having a peak wavelength of 395 nm. In the case where silicon compositional ratio w was 1.01 in the fluorescent substance manufactured by the conventional method, the emission efficiency was found to be 80% of the value in the case where the silicon compositional ratio was 1.00 and the fluorescent substance was excited by the light emitted from a blue light-emitting diode and having a peak wavelength of 465 nm. Likewise, in the case where silicon compositional ratio w was 1.02 in the fluorescent substance manufactured by the conventional method, the emission efficiency was found to be 35% of the value in the case where the silicon compositional ratio was 1.00 and the fluorescent substance was excited by the light emitted from a blue light-emitting diode and having a peak wavelength of 465 nm.

It should also be noted that, in the fluorescent substance manufactured by the conventional method, the emission efficiency under the excitation with a light emitted from a blue light-emitting diode and having a peak wavelength of 465 nm is decreased with increase in the Eu content. To be more specific, in the case where the Eu compositional ratio z is not smaller than 0.03, i.e., $z \geq 0.03$, the emission efficiency of the fluorescent substance is not higher than 50% of the emission efficiency in the case where the Eu compositional ratio z is 0.025. On the other hand, when it comes to the fluorescent substance manufactured by the method involving the reduction under a thorough reducing gas atmosphere according to the embodiment of the present invention, the emission efficiency was found to increase with increase in the Eu content. To be more specific, the emission efficiency is increased to 130% in the case where the Eu compositional ratio z is 0.055 and to 120% in the case where the Eu compositional ratio z is 0.07. The absorption intensity within the wavelength region of 440 nm to 480 nm was increased so as to make it possible to apply the fluorescent substance of the embodiment of the present invention to an LED of a blue light excitation type. Further, the change in the emission efficiency relative to the change in the silicon content was made moderate, thereby obtaining an allowance in the manufacturing process. Likewise, the resistance to water was improved in the fluorescent substance according to the embodiment of the present invention. In the case of the conventional fluorescent substance having the silicon compositional ratio w not higher than 1, i.e., $w \leq 1$, the swelling phenomenon was frequently observed when the fluorescent substance was left to stand within a room. However, the swelling phenomenon ceased to be observed in the fluorescent substance according to the embodiment of the present invention.

As described above, the fluorescent substance manufactured by the method according to the embodiment of the present invention was found to exhibit a marked improvement in the emission efficiency, compared with the fluorescent substance having a silicon compositional ratio w higher than 1.00, i.e., w>1.00, and manufactured by the conventional method. In the case where $w \leq 1$, it is also possible to obtain a fluorescent substance exhibiting the emission efficiency substantially equal to that of the conventional fluorescent substance by employing the manufacturing method according to the embodiment of the present invention for manufacturing the fluorescent substance. In the fluorescent substance manufactured by the method according to the embodiment of the present invention, it is possible to obtain the emission efficiency substantially equal to that of the fluorescent substance manufactured by the conventional method in the case where the Eu compositional ratio z is smaller than 0.03, i.e., Eu<0.03. Particularly, where the Eu compositional ratio is high, it is possible to obtain a markedly high emission efficiency. The present invention increases the allowance in the fluorescent substance manufacturing process, and the resistance of the fluorescent substance to water is improved by the present invention. These effects can be recognized in general in the fluorescent substance of the alkaline earth metal silicate of the composition other than $Me_2SiO_4$ (Me representing at least one of alkaline earth elements including Mg), for example, $Me_3Si_2O_7$ and $Me_3MgSi_2O_8$.

FIG. 3 is a cross sectional view showing the construction of a light-emitting device according to one embodiment of the present invention.

In the light-emitting device shown in the drawing, a resinous stem 200 comprises a pair of leads 201 and 202 forming a lead frame, and a resin portion 203 formed integral with the lead frame. The resin portion 203 includes a recess 205 having an upper opening, an area of which is made larger than that of the bottom thereof. The inner wall of this recess 205 is formed into a light-reflection surface 204.

A light-emitting chip 206 is mounted by using, for example, a Ag paste to the central portion of the substantially circular bottom surface of the recess 205. It is possible to use a light-emitting chip capable of an ultraviolet light emission or a visible light emission as the light-emitting chip 206. It is possible to use, for example, a GaAs-based semiconductor light-emitting diode or a GaN-based semiconductor light-emitting diode as the light-emitting chip 206. The electrodes (not shown) of the light-emitting chip 206 are connected to the leads 201 and 202 via bonding wires 207 and 208, respectively. Incidentally, it is possible to change appropriately the arrangement of the leads 201 and 202.

A fluorescent layer 209 is arranged within the recess 205 of the resin portion 203. The fluorescent layer 209 can be formed by, for example, dispersing the fluorescent substance 210 according to the embodiment of the present invention in a resin layer 211 formed of, for example, a silicone resin in an amount of 5 wt % to 50 wt %.

It is possible for the light-emitting chip 206 to be a flip chip type where an n-type electrode and a p-type electrode on the same plane. In this case, it is possible to overcome the problems derived from the wire such as the breakage or peeling of the wire and the light absorption so as to obtain a semiconductor light-emitting device of a high brightness having a high reliability. It is also possible to obtain the construction given below by using an n-type substrate in the light-emitting chip 206. Specifically, an n-type electrode is formed on the rear surface of an n-type substrate, and a p-type electrode is formed on the upper surface of a semiconductor layer on the substrate, followed by mounting the n-type electrode and the p-type electrode to the leads. It is possible for the p-type electrode or the n-type electrode to be connected to the other lead by using a wire. It is possible to change appropriately the size of the light-emitting chip 206 and the size and shape of the recess 205.

It is possible for the fluorescent substance according to the embodiment of the present invention to emit luminescence of colors ranging from green to orange by the excitation with a light having a wavelength of 360 nm to 500 nm. It follows that it is possible to obtain a light-emitting device emitting luminescence of various colors by combining the fluorescent substance described above with a light-emitting diode having emission peak within the wavelength region of 360 nm to 500 nm such that the fluorescent substance covers the light-emitting diode. Where the light-emitting diode emits a blue light having a wavelength of 440 nm to 480 nm, it is possible to form a light-emitting device having a high output and emitting a white light by the combination with at least one selected from the group consisting of a fluorescent substance emitting luminescence of yellowish green, a fluorescent substance emitting luminescence of yellow, and a fluorescent substance emitting luminescence of colors ranging from orange to red light. Also, where the light-emitting diode emits a ultraviolet light to a violet light having a wavelength of 360 nm to 440 nm, it is possible to form a light-emitting device having a high output and emitting a white light by the combination with at least one selected from the group consisting of a fluorescent substance emitting luminescence of blue, a fluorescent substance emitting luminescence of yellowish green, a fluorescent substance emitting luminescence of yellow, and a fluorescent substance emitting luminescence of colors ranging from orange to red.

Alternatively, in the embodiment of the present invention, other kind of light-emitting element may be used. For example, a laser emitting ultraviolet light or visible light may be used.

EXAMPLES

The present invention will now be described more in detail with reference to Examples and Comparative Examples. Needless to say, however, the technical scope of the present invention is not limited to the following Examples.

Example 1

Prepared first was a fluorescent substance having a composition of $Sr_{1.824}Ba_{0.103}Eu_{0.073}Si_{1.007}O_{4.014}$. To be more specific, prepared were the starting material powders comprising 94.27 g of $(SrCO_3)$ powder, 7.12 g of $(BaCO_3)$ powder, 22.835 g of $(SiO_2)$ powder, and 4.460 g of $(Eu_2O_3)$ powder. Further, 1.8 g of $NH_4Cl$ used as a crystal growth-promoting agent was added to the starting material powders, followed by uniformly mixing the starting material powders by using a ball mill.

The mixed raw material thus obtained was charged in an alumina crucible and fired under the conditions given below. In the first step, the mixed starting material was fired at 1,000 to 1,600° C. for 3 to 7 hours under a reducing gas atmosphere of $N_2/H_2$ so as to obtain a first fired material. The first fired material was pulverized and placed again in a crucible. The crucible was placed in a furnace and, then, a nitrogen gas was substituted within the furnace under vacuum. Further, the pulverized material was fired at 1,000 to 1,600° C. for 2 to 6 hours under a reducing gas atmosphere of $N_2/H_2$ having a hydrogen concentration of 1 to 100% so as to obtain a second fired material. The second fired material thus obtained was pulverized within water, followed by sieving and, then, dehydrating the pulverized material by means of an aspirating filtration. Finally, the second fired material was dried within a dryer at 150° C., followed by sieving the dried second fired material so as to obtain a fluorescent substance of this example.

FIG. 4 shows the emission spectrum of the fluorescent substance of this example, which was excited by light emitted from a light-emitting diode and having a peak wavelength of 395 nm. The emission spectrum shown in FIG. 4 was obtained by the measurement with an IMUC-7000 type instant multi light measuring system, manufactured by Otsuka Denshi, K. K. As apparent from FIG. 4, the fluorescent substance of this example did not have an emission band A in the vicinity of 495 nm, which is recognized in the emission spectrum shown in FIG. 2, and had an emission band B alone in the vicinity of 560 nm.

Further, fluorescent substances for Examples 2 to 10 and Comparative Examples 1 and 2 were manufactured by changing the amounts of the constituting elements of the fluorescent substances as shown in Table 1. Also, Comparative Example 3 is directed to a sample exhibiting the emission spectrum shown in FIG. 2.

TABLE 1

| | | Sr $2(1 - x - y - z)$ | Ba $2x$ | Eu $2z$ | Si W | Eu Valency |
|---|---|---|---|---|---|---|
| Examples | 1 | 1.82 | 0.108 | 0.072 | 1.01 | 2+ |
| | 2 | 1.80 | 0.101 | 0.099 | 1.02 | 2+ |
| | 3 | 1.84 | 0.107 | 0.053 | 1.02 | 2+ |
| | 4 | 1.80 | 0.097 | 0.103 | 1.02 | 2+ |
| | 5 | 1.84 | 0.106 | 0.054 | 1.02 | 2+ |
| | 6 | 1.85 | 0.097 | 0.053 | 1.05 | 2+ |
| | 7 | 1.79 | 0.101 | 0.109 | 1.03 | 2+ |
| | 8 | 1.85 | 0.095 | 0.055 | 1.02 | 2+ |
| | 9 | 1.83 | 0.101 | 0.069 | 1.03 | 2+ |
| | 10 | 1.76 | 0.099 | 0.141 | 1.09 | 2+ |
| Comparative Examples | 1 | 1.95 | 0.000 | 0.050 | 1.00 | 2+ |
| | 2 | 1.82 | 0.130 | 0.050 | 1.00 | 2+ |
| | 3 | 1.84 | 0.120 | 0.040 | 0.99 | 2+, 3+ |

The valency of Eu was analyzed by XANES, with the result that Eu was found to be $Eu^{2+}$. Also, as a result of the X-ray diffraction, the crystal structure of the fluorescent substance for each of Examples 1 to 10 was found to be orthorhombic. The fluorescent substance having the orthorhombic crystal structure is desirable because the fluorescent substance is capable of emitting luminescence having a wavelength longer than that of the luminescence emitted from the fluorescent substance having a monoclinic crystal structure.

Examples 11 to 20

The fluorescent substance for Example 1 was dispersed in an epoxy resin so as to prepare a resinous mixture. The resinous mixture thus prepared was combined with a light-emitting diode having a peak wavelength of 465 nm so as to obtain a white LED. FIG. 5 shows the emission spectrum of the white LED thus obtained. The emission spectrum given in FIG. 5 shows that the light emitted from the LED has a chromaticity value of x=0.34 and y=0.30 and a color temperature of 5,300K.

Also, a white LED for each of Examples 12 to 20 was manufactured similarly, except that used was the fluorescent substance for each of Examples 2 to 10. The output of the white LED was evaluated as Examples 12 to 20. Further, a white LED for Comparative Example 4 was manufactured by combining a similar exciting light source with the fluorescent substance for Comparative Example 2. Table 2 shows the relative outputs of the white LED's for Examples 12 to 20 on the basis that the output of LED for Comparative Example 4 was set at 1.

TABLE 2

| Examples | Relative output value of white color |
|---|---|
| 11 | 1.09 |
| 12 | 1.35 |
| 13 | 1.07 |
| 14 | 1.34 |
| 15 | 1.30 |
| 16 | 1.27 |
| 17 | 1.13 |
| 18 | 1.15 |
| 19 | 1.02 |
| 20 | 1.06 |

As apparent from Table 2, the white LED for each of the Examples of the present invention exhibits a high output.

Example 21 (LED)

The fluorescent substance for Example 5, a blue fluorescent substance and a red fluorescent substance were dispersed in a silicone resin so as to prepare a resinous mixture. Incidentally, a europium-activated alkaline earth chlorophosphate fluorescent substance was used as the blue fluorescent substance, and a europium-activated lanthanum oxysulfide fluorescent substance was used as the red fluorescent substance. An LED package having an LED chip having an emission peak wavelength of 395 nm mounted thereto was coated with the resinous mixture so as to manufacture a light-emitting device constructed as shown in FIG. 3.

A white light having high color rendering properties was emitted from the light-emitting device.

As described above, one embodiment of the present invention provides a fluorescent substance that permits manufacturing a light-emitting device of a high output, provides a manufacturing method of the particular fluorescent substance, and also provides a light-emitting device of a high output.

What is claimed is:

1. A fluorescent substance comprising an alkaline earth metal silicate having a composition represented by the following general formula (1):

$$(Sr_{1-x-y-z}Ba_xCa_yEu_z)_2Si_wO_{2+2w} \quad (1)$$

where x, y, z and w fall within the ranges of:
$0 \leq x \leq 0.97$; $0 \leq y \leq 0.97$;
$0.03 \leq z \leq 0.20$; $1.00 < w < 1.10$.

2. The fluorescent substance according to claim 1, wherein an emission spectrum of the fluorescent substance as it is excited by light having a wavelength ranging from 360 nm to 500 nm has a single emission band having a peak wavelength of 500 nm to 600 nm.

3. The fluorescent substance according to claim 1, wherein a largest peak exists at 6970±4 eV when the fluorescent substance is subjected to the XANES analysis.

4. The fluorescent substance according to claim 1, wherein z in the general formula (1) falls within a range of 0.035 to 0.075.

5. The fluorescent substance according to claim 1, wherein $Eu^{2+}$ is contained in an amount larger than the amount of $Eu^{3+}$ in the fluorescent substance.

6. The fluorescent substance according to claim 1, wherein a crystal structure of the fluorescent substance is an orthorhombic system.

7. A method for manufacturing a europium-activated alkaline earth metal silicate fluorescent substance comprising:
storing a mixture of raw materials into a vessel;
applying a first baking to the mixture of the raw materials under a reducing gas atmosphere of $N_2/H_2$ so as to obtain a first baked material;
pulverizing the first baked material to obtain a pulverized first baked material;
storing the pulverized first baked material into a vessel;
placing the vessel storing the pulverized first baked material in a furnace and substituting a nitrogen gas in the furnace under vacuum; and
applying a second baking to the pulverized first baked material under a reducing gas atmosphere of $N_2/H_2$ having a hydrogen concentration of 1 to 100% so as to obtain a second baked material.

8. The method according to claim 7, wherein the first baking is performed at 1,000 to 1,600° C.

9. The method according to claim 7, wherein the first baking is performed for 3 to 7 hours.

10. The method according to claim 7, wherein the vacuum denotes a pressure of 1,000 Pa or less.

11. The method according to claim 7, wherein the second baking is performed at 1,000 to 1,600° C.

12. The method according to claim 7, wherein the second baking is performed for 2 to 6 hours.

13. A light-emitting device comprising:
a light-emitting element configured to emit a light having a wavelength of 360 nm to 500 nm, and
a layer comprising a fluorescent substance formed on the light-emitting element, the fluorescent substance comprising an alkaline earth metal silicate having a composition represented by the following general formula (1):

$$(Sr_{1-x-y-z}Ba_xCa_yEu_z)_2Si_wO_{2+2w} \quad (1)$$

where x, y, z and w fall within the ranges of:
$0 \leq x \leq 0.97$; $0 \leq y \leq 0.97$;
$0.03 \leq z \leq 0.20$; $1.00 < w < 1.10$.

14. The light-emitting device according to claim 13, wherein the light-emitting element emits an ultraviolet light or a visible light.

15. The light-emitting device according to claim 13, wherein the layer comprises the fluorescent substance in an amount of 5 to 50 wt %.

16. The light-emitting device according to claim 13, wherein z in general formula (1) falls within a range of 0.035 to 0.075.

17. The light-emitting device according to claim 13, wherein $Eu^{2+}$ is contained in an amount larger than the amount of $Eu^{3+}$ in the fluorescent substance.

18. The light-emitting device according to claim 13, wherein a crystal structure of the fluorescent substance is an orthorhombic system.

19. The light-emitting device according to claim 13, wherein the light-emitting element emits a blue light having a wavelength of 440 nm to 480 nm, and the layer further comprises at least one selected from the group consisting of a fluorescent substance emitting luminescence of yellowish green, a fluorescent substance emitting luminescence of yellow, and a fluorescent substance emitting luminescence of colors ranging from orange to red light.

20. The light-emitting device according to claim 13, wherein the light-emitting element emits an ultraviolet to violet light having a wavelength of 360 nm to 440 nm, and the layer further comprises at least one selected from the group consisting of a fluorescent substance emitting luminescence of blue, a fluorescent substance emitting luminescence of yellowish green, a fluorescent substance emitting luminescence of yellow, and a fluorescent substance emitting luminescence of colors ranging from orange to red.

* * * * *